US010323321B1

(12) United States Patent
Yuan et al.

(10) Patent No.: US 10,323,321 B1
(45) Date of Patent: Jun. 18, 2019

(54) THERMAL CHEMICAL VAPOR DEPOSITION PROCESS AND COATED ARTICLE

(71) Applicant: SILCOTEK CORP., Bellefonte, PA (US)

(72) Inventors: Min Yuan, State College, PA (US); Paul H. Silvis, Port Matilda, PA (US); James B. Mattzela, Port Matilda, PA (US)

(73) Assignee: SILCOTEK CORP., Bellefonte, PA (US)

( * ) Notice: Subject to any disclaimer, the term of this patent is extended or adjusted under 35 U.S.C. 154(b) by 566 days.

(21) Appl. No.: 14/990,889

(22) Filed: Jan. 8, 2016

(51) Int. Cl.
  *C23C 16/24* (2006.01)
  *C23C 16/44* (2006.01)

(52) U.S. Cl.
  CPC .............. *C23C 16/24* (2013.01); *C23C 16/44* (2013.01)

(58) Field of Classification Search
  None
  See application file for complete search history.

(56) References Cited

U.S. PATENT DOCUMENTS

| | | | |
|---|---|---|---|
| 4,173,661 A | 11/1979 | Bourdon | |
| 4,579,752 A | 4/1986 | Dubois et al. | |
| 4,671,997 A | 6/1987 | Galasso et al. | |
| 4,714,632 A | 12/1987 | Cabrera et al. | |
| 4,741,964 A | 5/1988 | Haller | |
| 4,749,631 A | 6/1988 | Haluska et al. | |
| 4,753,856 A | 6/1988 | Haluska et al. | |
| 4,792,460 A | 12/1988 | Chu et al. | |
| 4,842,888 A | 6/1989 | Haluska et al. | |
| 5,160,544 A | 11/1992 | Garg et al. | |
| 5,250,451 A | 10/1993 | Chouan | |
| 5,299,731 A | 4/1994 | Liyanage et al. | |
| 5,480,677 A | 1/1996 | Li et al. | |
| 5,481,135 A | 1/1996 | Chandra et al. | |
| 5,562,952 A | 10/1996 | Nakahigashi et al. | |
| 5,563,102 A * | 10/1996 | Michael | H01L 23/5329 257/E23.167 |
| 5,818,071 A | 10/1998 | Loboda et al. | |
| 5,825,078 A | 10/1998 | Michael | |
| 5,858,544 A * | 1/1999 | Banaszak Holl | B05D 7/16 428/447 |
| 6,159,871 A | 12/2000 | Loboda et al. | |
| 6,444,326 B1 | 9/2002 | Smith | |
| 6,472,076 B1 | 10/2002 | Hacker | |
| 6,511,760 B1 | 1/2003 | Barone et al. | |
| 6,531,398 B1 | 3/2003 | Gaillard et al. | |
| 6,593,655 B1 | 7/2003 | Loboda et al. | |
| 7,070,833 B2 | 7/2006 | Smith et al. | |
| 7,867,627 B2 | 1/2011 | Smith et al. | |
| 2004/0175579 A1 | 9/2004 | Smith et al. | |
| 2006/0216952 A1 | 9/2006 | Bhanap et al. | |
| 2012/0251797 A1 | 10/2012 | Smith et al. | |
| 2013/0244025 A1 | 9/2013 | Smith et al. | |
| 2013/0260575 A1 * | 10/2013 | Al-Rashid | H01L 21/02203 438/789 |
| 2014/0370300 A1 | 12/2014 | Smith | |
| 2015/0030885 A1 | 1/2015 | Smith | |
| 2015/0283307 A1 | 10/2015 | Smith et al. | |
| 2015/0291830 A1 * | 10/2015 | Galbreath | B05D 1/62 428/216 |
| 2017/0130334 A1 * | 5/2017 | Yuan | C23C 16/45557 |

OTHER PUBLICATIONS

Restek Performance Coatings Service Through Technology, www.restekcorp.com, 2003, 1 pg.
D.A. Smith, D. Shelow and G. Barone, "Instrument and Sampling Equipment Passivation Requirements to Meet Current Demands for Low-Level Sulfur Analysis," 2001, 37 pgs.
Fast Facts At-a-Glance Product Information from Restek, Silcosteel—UHV, Dramatically Reduce Outgassing in UHV Systems, www.restekcorp.com, 2001, 2 pgs.
Fast Facts At-a-Glance Product Information from Restek, Silcosteel—CR, Achieve Specialty Alloy Performance Using Austenitic Stainless Steels, www.restekcorp.com, 2004, 4 pgs.
D.A. Smith, G.B. Stidsen, B. Burger and D. Shelow, "The Containment and Transfer of Trace Sulfur Gases at Low-PPBV Levels," 2001, 37 pgs.
G.A. Barone, D.A. Smith and M. Higgins, "Anti-Corrosive and Anti-Coking Properties of Unique Surface Coatings for Metal Substrates in Petrochemical Service," www.restekcorp.com, obtained Feb. 2015, 19 pgs.
G.A. Barone, D.A. Smith and D. Shelow, "Advantages to Using Inert, Coated Components for Sampling & Measurement of Organo-Sulfur Compounds," www.restekcorp.com, obtained Feb. 2015, 17 pgs.
R.L. Firor and B.D. Quimby, "Dual-Channel Gas Chromatographic System for the Determination of Low-Level Sulfur in Hydrocarbon Gases," Agilent Technologies, Inc., Mar. 2003, 10 pgs.
R.L. Firor, "Use of GC/MSD for Determination of Volatile Sulfur: Application in Natural Gas Fuel Cell Systems and Other Gaseous Streams," Agilent Technologies, Inc., Nov. 2001, 10 pgs.
V. Pretorius and J.D. Du Toit, "Gas Chromatography in Glass and Fused Silica Capillary Columns: Deactivation of the Inner Surface Using Silicon Films," Journal of HRC & CC, 1981, 2 pgs.

(Continued)

*Primary Examiner* — Robert T Butcher

(74) *Attorney, Agent, or Firm* — McNees Wallace & Nurick, LLC

(57) ABSTRACT

Thermal chemical vapor deposition processes and coated articles are disclosed. The coated article includes a surface having a surface impurity and a coating on the surface formed by thermally reacting a gas. In comparison to a comparable coating without the surface impurity, the coating on the surface has substantially the same level of adhesion, corrosion resistance over 24 hours in 6M HCl, corrosion resistance over 72 hours in NaClO, and electrochemical impedance spectroscopy results. Additionally or alternatively, the surface impurity has properties that reduce or eliminate adhesion of a comparative coating produced by decomposition of silane on a comparative surface following exposure of the surface to a temperature.

10 Claims, No Drawings

(56) References Cited

OTHER PUBLICATIONS

D.A. Smith, M. Higgins and G. Barone, "Evaluation of System Surfaces in Low-Level Sulfur Analysis for the Petrochemical Industry," www.restekcorp.com, obtained Feb. 2015, 37 pgs.

G. Barone, D.Smith and M. Higgins, "Selection of Surface Coatings for Process Lines and Equipment Used in Corrosive and Reactive Streams", Analytical Solutions for Energy Optimization & Environmental Compliance, The 54th Annual Symposium of the Analysis Division, Apr. 2009, 17 pgs.

J. De Zeeuw, G. Barone and M. Higgins, "Comparing Surface Adsorption Effects During the Analysis of Mercury and Sulfur Containing Streams," www.restekcoatings.com, obtained Feb. 2015, 30 pgs.

G. Barone, D. Smith, M. Higgins and T. Neeme, "Study of Chemical and Physical Adsorption Properties of Moisture, Sulfur, and Mercury Streams Through a Variety of Tubing Substrates," ISA 53rd Analysis Division Symposium, 2008, 9 pgs.

D.A. Smith and J.B. Mattzela, The Deposition and Functionalization of Silicon-Based Materials to Prevent Surface Corrosion, Adsorption, Contamination and Catalytic Interactions, MS&T'09, Oct. 2009, 21 pgs.

W. Bertsch and V. Pretorius, "Deactivation of Metal Surfaces for Capillary Columns for GC by Deposition of Silicon," Journal of HRC&CC, 1982, 3 pgs.

G.G. Gerhab and A. Schuyler, "Highly Inert Sample Pathways," 1996, 16 pgs.

A. Schuyler, J.W. Stauffer, C.E. Loope and C.R. Vargo, "Highly Efficient and Inert Stainless Steel GC Columns: A Durable, Flexible Alternative to Fused Silica," Elsevier Science Publishers, 1992, 6 pgs.

G. Gerhab and A. Schuyler, "Efficient and Rapid GC Analysis With Rugged Metal Microbore Capillary Columns," www.restekcorp.com, obtained Feb. 2015, 18 pgs.

J. De Zeeuw, "Deactivation of Metal Surfaces: Applications in Gas Chromatography (GC) for the Past 15 Years," American Laboratory, Nov. 2012, 10 pgs.

* cited by examiner

THERMAL CHEMICAL VAPOR DEPOSITION PROCESS AND COATED ARTICLE

FIELD OF THE INVENTION

The present invention is directed to thermal chemical vapor deposition. More particularly, the present invention is directed to thermal chemical vapor deposition processes and coated articles.

BACKGROUND OF THE INVENTION

To ensure maximum coating quality and customer satisfaction, coating services providers go through great efforts to make sure that all parts are clean (free of oil, grease, embedded particles, and other impurities) before they are coated. For example, parts usually go through surface preparation steps to clean and prepare parts before initiating thermal chemical vapor deposition processes. Such efforts can be costly and can require substantial infrastructure. In addition, such cleaning procedures are incompatible with certain parts and materials.

Such contaminants impact different coating techniques in different ways. For example, depending upon the nature of the contaminants, unclean substrates may outgas under heat during a thermal chemical vapor deposition run, which results in poor adhesion and/or cosmetic defects. Sometimes these defects can become initiation points for corrosion, and can cause a protective coating to fail sooner than expected. Additionally or alternatively, the cosmetic defects can be highlighted by the chemical vapor deposition coatings.

Thermal chemical vapor deposition processes and coated articles that show one or more improvements in comparison to the prior art would be desirable in the art.

BRIEF DESCRIPTION OF THE INVENTION

In an embodiment, a coated article includes a surface having a surface impurity and a coating on the surface formed by thermally reacting a gas. The surface impurity includes one or more of fingerprint residue, human skin secretions, oil, grease, food, paint, and soap. In comparison to a comparable coating without the surface impurity, the coating on the surface has substantially the same level of adhesion, has substantially the same level of corrosion resistance over 24 hours in 6M HCl, has substantially the same level of corrosion resistance over 72 hours in NaClO, and has substantially the same electrochemical impedance spectroscopy results.

In another embodiment, a coated article includes a surface having a surface impurity and a coating on the surface formed by thermally reacting a gas following exposure of the surface to a temperature above 300° C. The surface impurity has properties that reduce or eliminate adhesion of a comparative coating produced by decomposition of silane on a comparative surface without the exposure of the surface to the temperature above 300° C., the comparative surface having properties identical to the surface. The coating has greater adhesion properties than the properties of the comparative coating.

In another embodiment, a thermal chemical vapor deposition process includes providing a surface having a surface impurity and applying a coating to the surface by reacting a gas following exposure of the surface to a temperature above 300° C. The surface impurity has properties that reduce or eliminate adhesion of a comparative coating produced by decomposition of silane on a comparative surface without the exposure of the surface to the temperature above 300° C., the comparative surface having properties identical to the surface. The coating has greater adhesion properties than the properties Other features and advantages of the present invention will be apparent from the following more detailed description, which illustrates, by way of example, the principles of the invention.

DETAILED DESCRIPTION OF THE INVENTION

Provided are thermal chemical vapor deposition processes and coated articles. Embodiments of the present disclosure, for example, in comparison to concepts failing to include one or more of the features disclosed herein, reduce or eliminate the pre-cleaning efforts, permit more efficient production of coatings, permit coating of a wide range of geometries (for example, narrow channels/tubes, three-dimensionally complex geometries, and/or hidden or non-line-of-site geometries, such as, in needles, tubes, probes, fixtures, complex planar and/or non-planar geometry articles, simple non-planar and/or planar geometry articles, and combinations thereof), permit coating of a bulk of articles, or permit a combination thereof.

According to the disclosure, a coated article produced by the process has a surface with a surface impurity. The surface impurity is coated by a coating produced by thermally reacting a gas. In a comparative coating on an identical surface produced by decomposition of silane, the surface impurity reduces or eliminates adhesion. In the presently disclosed coating, the impact of the surface impurity is reduced or eliminated. Stated another way, the coating has greater adhesion properties than the properties of the comparative coating in the presence of the surface impurity. Examples of the surface impurity include, but are not limited to, fingerprint residue, human skin secretions, oil, grease, food, paint, soap, and combinations thereof.

Additionally or alternatively, in comparison to the comparable coating without the surface impurity, the coating on the surface has substantially the same level of adhesion, has substantially the same level of corrosion resistance over 24 hours in 6M HCl, has substantially the same level of corrosion resistance over 72 hours in NaClO, and/or has substantially the same electrochemical impedance spectroscopy results. For example, in one embodiment, the comparison includes a comparable coated article without the fingerprints having a corrosion rate of between 0.5 mils per year and 2.0 mils per year (for example, an average of 1.11 mils per year), with the coated article with the fingerprints having a corrosion rate of between 1.0 mils per year and 1.6 mils per year (for example, an average of 1.29 mils per year). In another embodiment, the comparable coated article without the fingerprints has a corrosion rate of between 0.3 mils per year and 5.0 mils per year (for example, an average of 1.79 mils per year), and the coated article with the fingerprints has a corrosion rate of between 1.2 mils per year and 2.6 mils per year (for example, 1.85 mils per year). In yet another embodiment, the comparable coated article with the fingerprints has substantially the same EIS results (for example, an impedance value of 2.646 Mohm at the beginning of test to 1.829 Mohm on day 64 in 5% NaCl solution) as the coated article with the fingerprints (for example, an impedance value of 1.911 Mohm at the beginning of test to 1.970 Mohm on day 42 in 5% NaCl solution).

According to the disclosure, the thermal chemical vapor deposition process includes reacting one or more gases in one or more steps in one or both of a chamber(s) and/or a vessel(s) to form a thermal chemical vapor deposition coating on a surface. The gas(es) is/are selected from the group consisting of trimethylsilane, dimethylsilane, methyltrimethoxysilane, methyltriethoxysilane, dimethyldimethoxysilane, dimethyldiethoxysilane, trimethylmethoxysilane, trimethylethoxysilane, and combinations thereof.

The surface is a layer on a substrate or is the substrate itself. In one embodiment, the surface is or includes a stainless steel surface (martensitic or austenitic), a nickel-based alloy, a metal surface, a metallic surface (ferrous or non-ferrous; tempered or non-tempered; and/or equiaxed, directionally-solidified, or single crystal), a ceramic surface, a ceramic matrix composite surface, a glass surface, ceramic matrix composite surface, a composite metal surface, a coated surface, a fiber surface, a foil surface, a film, a polymeric surface (such as, polyether etherketone), and/or any other suitable surface capable of withstanding operational conditions of the thermal chemical vapor deposition process.

In another embodiment, the surface is formed from a silane-based material, for example, formed from dimethylsilane (for example, in gaseous form), trimethylsilane, dialkylsilyl dihydride, alkylsilyl trihydride, non-pyrophoric species (for example, dialkylsilyl dihydride and/or alkylsilyl trihydride), thermally reacted material (for example, carbosilane and/or carboxysilane, such as, amorphous carbosilane and/or amorphous carboxysilane), species capable of a recombination of carbosilyl (disilyl or trisilyl fragments), and/or any other suitable silane-based material. Such materials may be applied iteratively and/or with purges in between, for example, with an inert gas (such as, nitrogen, helium, and/or argon, as a partial pressure dilutant).

Additionally, in further embodiments, the surface is treated. Suitable treatments include, but are not limited to, exposure to water (alone, with zero air, or with an inert gas), oxygen (for example, at a concentration, by weight, of at least 50%), air (for example, alone, not alone, and/or as zero air), nitrous oxide, ozone, peroxide, or a combination thereof. As used herein, the term "zero air" refers to atmospheric air having less than 0.1 ppm total hydrocarbons. The term "air" generally refers to a gaseous fluid, by weight, of mostly nitrogen, with the oxygen being the second highest concentration species within. For example, in one embodiment, the nitrogen is present at a concentration, by weight, of at least 70% (for example, between 75% and 76%) and oxygen is present at a concentration, by weight, of at least 20% (for example, between 23% and 24%).

The thermal chemical vapor deposition process includes one or more reaction steps within a temperature range to thermally react the gas(es) and facilitate deposition onto the surface. Suitable temperatures include, but are not limited to, between 100° C. and 700° C., between 100° C. and 450° C., between 100° C. and 300° C., between 200° C. and 500° C., between 300° C. and 600° C., between 450° C. and 700° C., 700° C., 450° C., 100° C., between 200° C. and 600° C., between 300° C. and 600° C., between 400° C. and 500° C., 300° C., 400° C., 500° C., 600° C., or any suitable combination, sub-combination, range, or sub-range thereof.

The thermal chemical vapor deposition process is within a pressure range facilitating the thermal reaction. Suitable pressures include, but are not limited to, between 0.01 psia and 200 psia, between 1.0 psia and 100 psia, between 5 psia and 40 psia, between 20 psia and 25 psia, 1.0 psia, 5 psia, 20 psia, 23 psia, 25 psia, 40 psia, 100 psia, 200 psia, or any suitable combination, sub-combination, range, or sub-range therein.

Suitable dimensions for the chamber and/or vessel used in the thermal chemical vapor deposition process include, but are not limited to, having a minimum width of greater than 5 cm, of greater than 10 cm, greater than 20 cm, greater than 30 cm, greater than 100 cm, greater than 300 cm, greater than 1,000 cm, between 10 cm and 100 cm, between 100 cm and 300 cm, between 100 cm and 1,000 cm, between 300 cm and 1,000 cm, any other minimum width capable of uniform or substantially uniform heating, or any suitable combination, sub-combination, range, or sub-range therein. Suitable volumes include, but are not limited to, at least 1,000 $cm^3$, greater than 3,000 $cm^3$, greater than 5,000 $cm^3$, greater than 10,000 $cm^3$, greater than 20,000 $cm^3$, between 3,000 $cm^3$ and 5,000 $cm^3$, between 5,000 $cm^3$ and 10,000 $cm^3$, between 5,000 $cm^3$ and 20,000 $cm^3$, between 10,000 $cm^3$ and 20,000 $cm^3$, any other volumes capable of uniform or substantially uniform heating, or any suitable combination, sub-combination, range, or sub-range therein.

EXAMPLES

According to a first example, a first stainless steel coupon is subjected to fingerprints and a second stainless steel coupon is not subjected to fingerprints. Both coupons are coated and maintain adhesion when tape is positioned on the coupons and removed.

According to a second example, 316L stainless steel coupons (including a coupon without fingerprints and a coupon subjected to fingerprints) are immersed into 6M HCl at room temperature for 24 hours per ASTM G31. The coupon without the fingerprints has a corrosion rate of between 0.5 mils per year and 2.0 mils per year, while the coupon with the fingerprints has a corrosion rate of between 1.0 mils per year and 1.6 mils per year.

According to a third example, 304 stainless steel coupons (including a coupon without fingerprints and a coupon subjected to fingerprints) are immerse in 15% sodium hypochlorite (NaClO, also known as concentrated bleach) at room temperature for 72 hours per ASTM G31. The coupon without the fingerprints has a corrosion rate of between 0.3 mils per year and 5.0 mils per year, while the coupon with the fingerprints has a corrosion rate of between 1.2 mils per year and 2.6 mils per year.

According to a fourth example, 304 stainless steel coupons (including a coupon without fingerprints and a coupon subjected to fingerprints) are exposed to 5% NaCl solution with Electrochemical Impedance Spectroscopy (EIS) monitoring. The coupon with the fingerprints has substantially the same EIS results as the coupon with the fingerprints.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A coated article, comprising:
   a metal substrate, the metal substrate including stainless steel or aluminum; and
   a coating on the metal substrate formed by thermally reacting a gas;
   wherein the gas is selected from the group consisting of methyltrimethoxysilane, methyltriethoxysilane, dimethyldimethoxysilane, dimethyldiethoxysilane, trimethylmethoxysilane, trimethylethoxysilane, and combinations thereof.

2. The coated article of claim 1, wherein the thermally reacting of the gas is within a temperature range of between 100° C. and 700° C.

3. The coated article of claim 1, wherein the thermally reacting of the gas is within a temperature range of between 100° C. and 450° C.

4. The coated article of claim 1, wherein the thermally reacting of the gas is within a temperature range of between 300° C. and 600° C.

5. The coated article of claim 1, wherein the thermally reacting of the gas is within a temperature range of between 250° C. and 400° C.

6. The coated article of claim 1, wherein the thermally reacting of the gas is within a pressure range of between 0.01 psia and 200 psia.

7. The coated article of claim 1, wherein the thermally reacting of the gas is within a pressure range of between 1.0 psia and 100 psia.

8. The coated article of claim 1, wherein the thermally reacting of the gas is within a pressure range of between 5 psia and 40 psia.

9. The coated article of claim 1, wherein the thermally reacting of the gas is within a chamber or vessel having a volumetric range of between 3,000 $cm^3$ and 5,000 $cm^3$.

10. The coated article of claim 1, wherein the thermally reacting of the gas is within a chamber or vessel having a volumetric range of between 10,000 $cm^3$ and 20,000 $cm^3$.

* * * * *